United States Patent
Yamaji et al.

(10) Patent No.: US 11,870,418 B2
(45) Date of Patent: Jan. 9, 2024

(54) ACOUSTIC WAVE DEVICE

(71) Applicant: Murata Manufacturing Co., Ltd., Nagaokakyo (JP)

(72) Inventors: Toru Yamaji, Nagaokakyo (JP); Tetsu Takahashi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 479 days.

(21) Appl. No.: 17/161,723

(22) Filed: Jan. 29, 2021

(65) Prior Publication Data
US 2021/0265970 A1    Aug. 26, 2021

(30) Foreign Application Priority Data
Feb. 21, 2020   (JP) ................. 2020-028349

(51) Int. Cl.
*H03H 9/02* (2006.01)
*H03H 9/25* (2006.01)
*H03H 9/64* (2006.01)
*H03H 9/145* (2006.01)

(52) U.S. Cl.
CPC .... *H03H 9/02543* (2013.01); *H03H 9/02842* (2013.01); *H03H 9/145* (2013.01); *H03H 9/25* (2013.01); *H03H 9/6406* (2013.01)

(58) Field of Classification Search
CPC ........ H03H 9/6406; H03H 9/25; H03H 9/145; H03H 9/02543; H03H 9/6483; H03H 9/02645; H03H 9/02842; H03H 9/6456; H03H 9/6436; H03H 9/02874
See application file for complete search history.

(56) References Cited

U.S. PATENT DOCUMENTS

| | | | | |
|---|---|---|---|---|
| 3,970,970 A * | 7/1976 | Worley | ............ | H03H 9/02771 333/195 |
| 8,253,302 B2 * | 8/2012 | Arakawa | ............ | H03H 9/02748 333/195 |
| 2007/0069837 A1 * | 3/2007 | Nishimura | ......... | H03H 9/14588 333/195 |
| 2009/0224854 A1 * | 9/2009 | Ohkubo | ............ | H03H 9/0057 333/193 |
| 2011/0032051 A1 * | 2/2011 | Kawamoto | ........... | H03H 9/725 333/133 |
| 2018/0262179 A1 | 9/2018 | Goto et al. | | |
| 2022/0360252 A1 * | 11/2022 | Nakamura | ............ | H03H 9/568 |

FOREIGN PATENT DOCUMENTS

JP   2018-129798 A   8/2018

* cited by examiner

*Primary Examiner* — Quan Tra
*Assistant Examiner* — Anh-Quan Tra
(74) *Attorney, Agent, or Firm* — Keating & Bennett, LLP

(57) ABSTRACT

An acoustic wave device includes first and second acoustic wave elements. The first acoustic wave element is disposed on a piezoelectric substrate, and includes at least one first IDT electrode. The second acoustic wave element is disposed on the piezoelectric substrate, and includes at least one second IDT electrode. The first and second acoustic wave elements are adjacent to each other in the direction of acoustic wave propagation. A diffracting component that diffracts an acoustic wave is disposed between the first IDT electrode and the second IDT electrode. The diffracting component includes a gap that defines and functions as a slit to diffract an acoustic wave.

19 Claims, 5 Drawing Sheets

ACOUSTIC WAVE DEVICE

CROSS REFERENCE TO RELATED APPLICATIONS

This application claims the benefit of priority to Japanese Patent Application No. 2020-028349 filed on Feb. 21, 2020. The entire contents of this application are hereby incorporated herein by reference.

BACKGROUND OF THE INVENTION

1. Field of the Invention

The present invention relates to an acoustic wave device used for resonators, band-pass filters, or other devices.

2. Description of the Related Art

In recent years, there has been widespread use of acoustic wave devices with plural acoustic wave elements disposed on the same piezoelectric substrate. In such acoustic wave devices, acoustic wave elements are disposed on the piezoelectric substrate in close proximity to each other. This configuration may cause acoustic coupling to occur between the interdigital transducer (IDT) electrode of one acoustic wave element and the IDT electrode of another acoustic wave element. Such acoustic coupling causes problems, such as ripple, appearing in the pass band of an acoustic wave filter.

Japanese Unexamined Patent Application Publication No. 2018-129798 describes a configuration in which, to prevent the acoustic coupling described above, a diagonally-extending diffraction pattern for diffracting acoustic waves is disposed between one IDT electrode and another IDT electrode. Further, an absorber is disposed between the one IDT electrode and the other IDT electrode to absorb acoustic waves.

The configuration described in Japanese Unexamined Patent Application Publication No. 2018-129798, which uses the diffraction pattern and the absorber, necessarily results in increased spacing between acoustic wave elements that are adjacent to each other. To achieve further miniaturization, it is necessary to reduce the dimension of such a diffraction pattern or absorber in the direction of acoustic wave propagation. Reducing this dimension, however, results in the inability to achieve sufficient suppression of acoustic coupling. Thus, it has been difficult to provide an acoustic wave device that is compact and at the same time allows for sufficient suppression of acoustic coupling. Another problem with the configuration using the diffraction pattern described above is that an acoustic wave having propagated through one acoustic wave element may propagate into the IDT electrode of the other acoustic wave element. That is, it is difficult with the above-described configuration to ensure that acoustic waves are reliably diffracted or reflected to the outside of the IDT electrode. It is therefore difficult with the above-described configuration to sufficiently suppress acoustic coupling.

SUMMARY OF THE INVENTION

Preferred embodiments of the present invention provide acoustic wave devices that are each able to sufficiently reduce or prevent acoustic coupling between mutually adjacent acoustic wave elements more effectively than is otherwise possible. Preferred embodiments of the present invention also provide acoustic wave devices that are each able to sufficiently reduce or prevent acoustic coupling between mutually adjacent acoustic wave elements, and also enable miniaturization.

According to a preferred embodiment of the present invention, an acoustic wave device includes a piezoelectric substrate, a first acoustic wave element, and a second acoustic wave element. The first acoustic wave element is disposed on the piezoelectric substrate, and includes at least one first IDT electrode including an intersecting region. The second acoustic wave element is disposed on the piezoelectric substrate, and includes at least one second IDT electrode including an intersecting region. The intersecting region of the at least one first IDT electrode and the intersecting region of the at least one second IDT electrode overlap each other in an overlap region in the direction of acoustic wave propagation. A diffracting component including a slit is provided in the overlap region.

The acoustic wave devices according to preferred embodiments of the present invention effectively reduce or prevent acoustic coupling between the first and second acoustic wave elements that are adjacent to each other.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings to facilitate understanding of the present invention.

It is to be noted that various preferred embodiments described herein are for illustrative purposes only, and some features or elements described with respect to different preferred embodiments may be substituted for or combined with one another.

Figure 1:
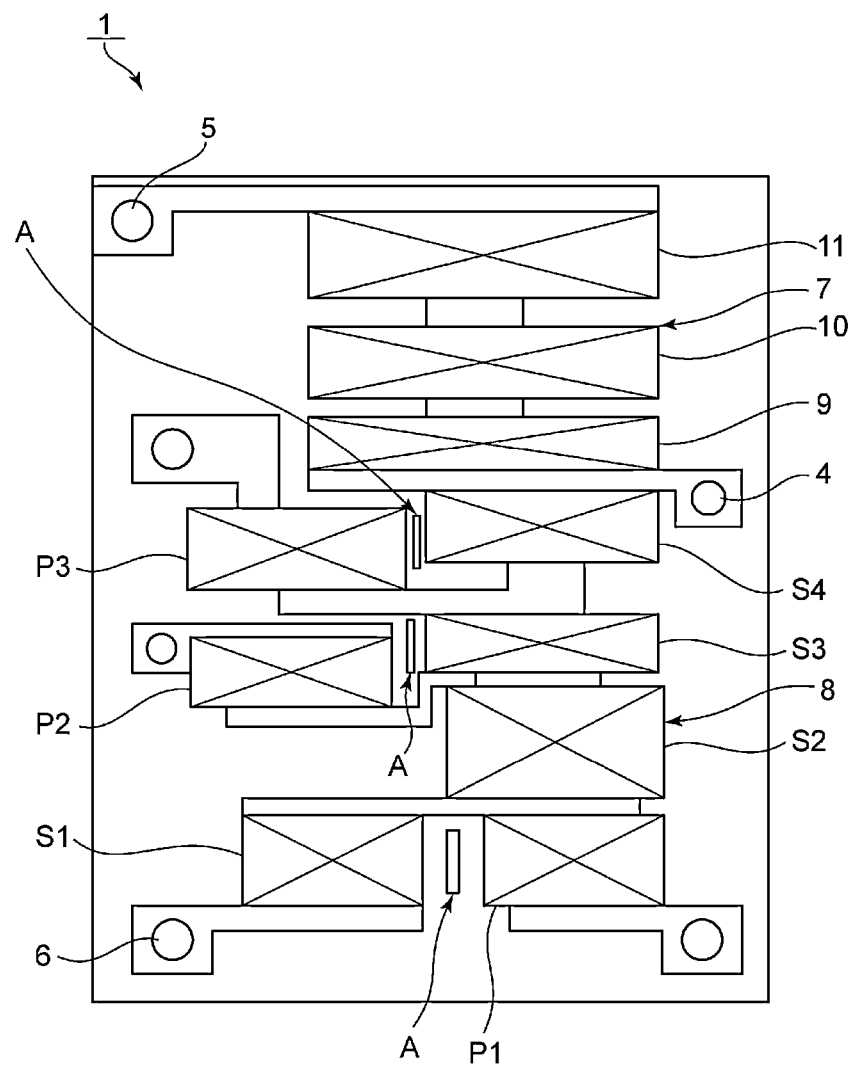
FIG. 1 is a schematic plan view of an acoustic wave device according to a first preferred embodiment of the present invention.
Figure 2A:
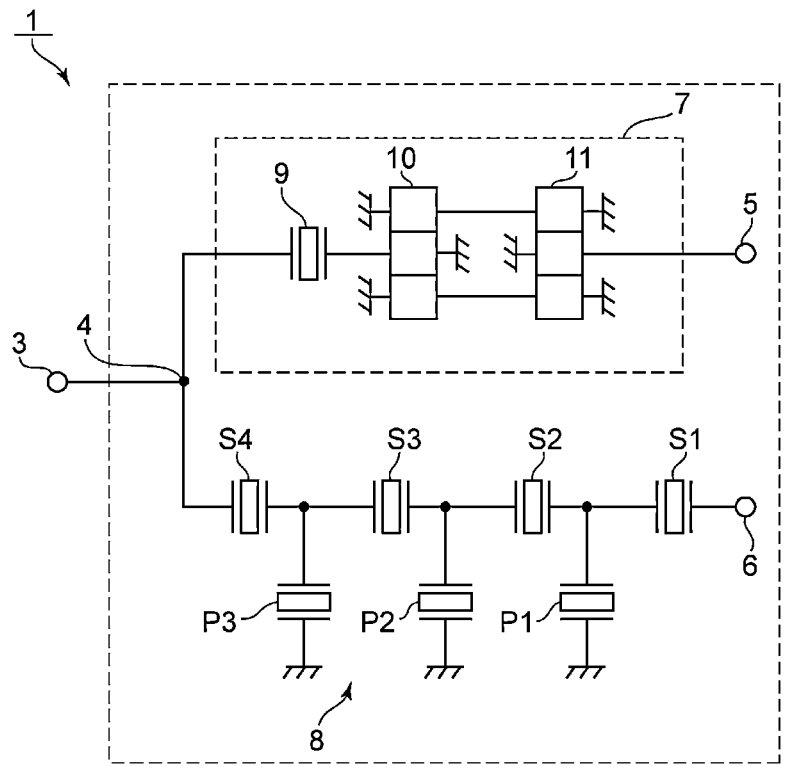
FIG. 2A is a circuit diagram of the acoustic wave device according to the first preferred embodiment of the present invention.

FIG. 1 is a schematic plan view of an acoustic wave device according to a first preferred embodiment of the present invention. FIG. 2A is a circuit diagram of the acoustic wave device.

An acoustic wave device 1 is a duplexer used in a smart phone or other devices. The acoustic wave device 1 includes a receiving filter 7 and a transmitting filter 8. The receiving filter 7 and the transmitting filter 8 are connected by a common terminal 4 common to the two filters. The common terminal 4 is connected to an antenna terminal 3. The receiving filter 7 is connected between the common terminal 4 and a receiving terminal 5. The transmitting filter 8 is connected between a transmitting terminal 6 and the common terminal 4.

The receiving filter 7 includes an acoustic wave resonator 9, and longitudinally coupled resonator acoustic wave filters 10 and 11. The transmitting filter 8 is, for example, a ladder filter including a plurality of acoustic wave resonators. More specifically, the transmitting filter 8 includes a plurality of series-arm resonators S1 to S4, and a plurality of parallel-arm resonators P1 to P3. The series-arm resonators S1 to S4, and the parallel-arm resonators P1 to P3 are each a 1-port acoustic wave resonator.

Figure 2B:
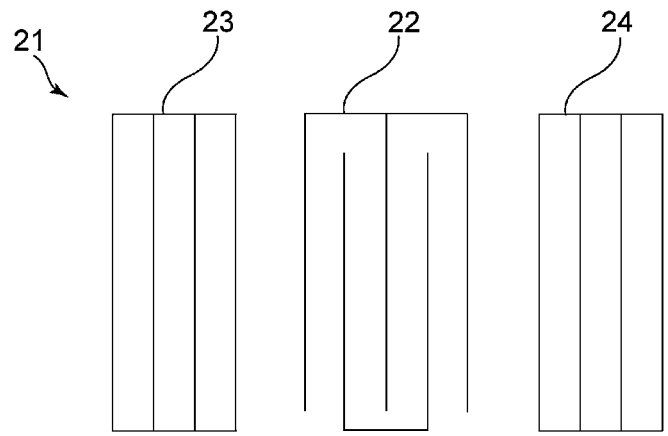
FIG. 2B is a schematic plan view of the electrode structure of an acoustic wave resonator used in the acoustic wave device according to the first preferred embodiment of the present invention.

FIG. 2B is a schematic plan view of the electrode structure of the 1-port acoustic wave resonator. An acoustic wave device 21 includes an IDT electrode 22, and reflectors 23 and 24 disposed at both sides of the IDT electrode 22 in the direction of acoustic wave propagation.

In FIG. 1, a symbol with an "X" bounded by a rectangular box is used to schematically represent each of the following components: the series-arm resonators S1 to S4 and the parallel-arm resonators P1 to P3, each of which is the acoustic wave resonator described above; the acoustic wave resonator 9; and the longitudinally coupled resonator acoustic wave filters 10 and 11. These resonators and filters are provided on a piezoelectric substrate. In FIG. 1, the parallel-arm resonator P3 and the series-arm resonator S4 are adjacent to each other in the direction of acoustic wave propagation. Similarly, the parallel-arm resonator P2 and the series-arm resonator S3 are adjacent to each other in the direction of acoustic wave propagation, and the series-arm resonator S1 and the parallel-arm resonator P1 are adjacent to each other in the direction of acoustic wave propagation.

With acoustic wave filters becoming increasingly smaller in recent years, the distance between mutually adjacent acoustic wave elements is becoming very small. Consequently, for example, an acoustic wave may propagate from one of the parallel-arm resonator P3 and the series-arm resonator S4 toward the other resonator, which may cause acoustic coupling between the two resonators. Such acoustic coupling may cause ripple to appear in the filter pass band.

In the acoustic wave device 1, a diffracting component schematically represented by an arrow A is disposed between the parallel-arm resonator P3 and the series-arm resonator S4, between the parallel-arm resonator P2 and the series-arm resonator S3, and between the series-arm resonator S1 and the parallel-arm resonator P1. This configuration is described in further detail below with reference to FIG. 3.

Figure 3:
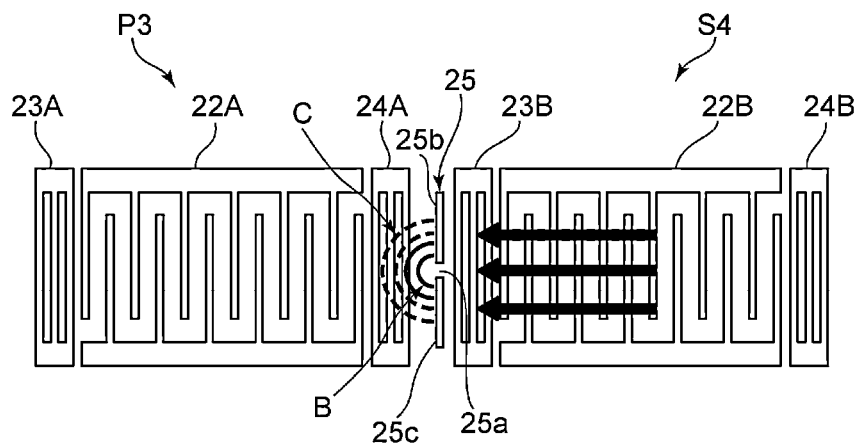
FIG. 3 is a plan view of the acoustic wave device according to the first preferred embodiment of the present invention, illustrating first and second acoustic wave elements that are adjacent to each other.

In FIG. 3, the parallel-arm resonator P3 and the series-arm resonator S4 are adjacent to each other. That is, FIG. 3 is a plan view of an area where a first acoustic wave element and a second acoustic wave element according to the present preferred embodiment are adjacent to each other. In this case, the parallel-arm resonator P3, which defines and functions as the first acoustic wave element, and the series-arm resonator S4, which defines and functions as the second acoustic wave element, are adjacent to each other. The parallel-arm resonator P3 includes a first IDT electrode 22A, and reflectors 23A and 24A. The series-arm resonator S4 includes a second IDT electrode 22B, and reflectors 23B and 24B. IDT electrodes included respectively in the parallel resonator P3 and the serial resonator S4 include an overlap region where their intersecting regions overlap each other in an acoustic wave propagating direction. Here, an intersecting region of an IDT electrode is a region where a first electrode finger and a second electrode finger which extends in an opposite direction overlap in an acoustic wave propagating direction. A diffracting component 25 is disposed between the first IDT electrode 22A and the second IDT electrode 22B, and more specifically, between the reflector 24A and the reflector 23B. The diffracting component 25 extends in a direction orthogonal or substantially orthogonal to the direction of acoustic wave propagation, and has a linear or substantially linear shape. The diffracting component 25 includes a gap 25a provided in a portion of the diffracting component 25 and extending in the direction orthogonal or substantially orthogonal to the direction of acoustic wave propagation. In the first preferred embodiment, the gap 25a is provided in a central or substantially central portion in the longitudinal direction of the diffracting component 25. Alternatively, however, the gap 25a may be provided at a location other than a central or substantially central portion in the longitudinal direction of the diffracting component 25.

The diffracting component 25 is not electrically connected to the reflectors 24A and 23B. Alternatively, however, the diffracting component 25 may be electrically connected to at least one of the reflector 24A and the reflector 23B.

The diffracting component 25 is preferably made of the same electrode material as the first and second IDT electrodes 22A and 22B. Further, the diffracting component 25 extends in the direction orthogonal or substantially orthogonal to the direction of acoustic wave propagation. The diffracting component 25 can thus be fabricated easily in the same process as that for fabricating the first and second IDT electrodes 22A and 22B and the reflectors 23A, 24A, 23B, and 24B.

Alternatively, however, the diffracting component 25 may be made of a material other than the electrode material identical to that of the IDT electrodes 22A and 22B. The diffracting component 25 may be made of any material other than metal, such as a ceramic material, provided that the diffracting component 25 includes the gap 25a that enables a diffraction phenomenon described later to be utilized.

The diffracting component 25 includes the gap 25a, which defines and functions as a slit to diffract acoustic waves. The diffracting component 25 includes a first portion 25b and a second portion 25c that extend in the direction orthogonal or substantially orthogonal to the direction of acoustic wave propagation. The space between the first portion 25b and the second portion 25c defines the gap 25a defining and functioning as a through slit. Alternatively, a slit according to a preferred embodiment of the present invention may be a non-through slit that does not penetrate the diffracting component in the direction of acoustic wave propagation. That is, the first and second portions 25b and 25c of the diffracting component 25 may connect with each other in a portion of the gap 25a to thus define a recess defining and functioning as a non-through slit. If the diffracting component 25 includes such a non-through slit, the diffracting component 25 is defined by a single unitary component. Alternatively, a plurality of diffracting components 25 may be disposed in the direction of acoustic wave propagation.

An acoustic wave excited by the first IDT electrode 22A of the parallel-arm resonator P3 has a wavelength different from the wavelength of an acoustic wave excited by the second IDT electrode 22B of the series-arm resonator S4. Therefore, the wavelength λ determined by the electrode finger pitch of the first IDT electrode 22A, and the wavelength λ determined by the electrode finger pitch of the second IDT electrode 22B are different from each other.

The dimension of the gap 25a in the direction orthogonal or substantially orthogonal to the direction of acoustic wave propagation, that is, the length of the gap 25a, is preferably smaller than both of the wavelength of an acoustic wave propagating in the first IDT electrode 22A and the wavelength of an acoustic wave propagating in the second IDT electrode 22B. More specifically, the length of the gap 25a is preferably smaller than both of the wavelength λ determined by the electrode finger pitch of the first IDT electrode 22A and the wavelength λ determined by the electrode finger pitch of the second IDT electrode 22B.

In the acoustic wave device 1, when a transmit signal is input to the transmitting filter 8, the transmit signal is input to the series-arm resonator S4, which defines and functions as the second acoustic wave element, and an acoustic wave is excited. As indicated by arrows in FIG. 3, the acoustic wave propagates toward the parallel-arm resonator P3, which defines and functions as the first acoustic wave element. In this case, due to the presence of the diffracting component 25 between the two resonators, as indicated by arrows B and C, the resulting diffraction phenomenon causes a propagating acoustic wave to scatter outward in the direction orthogonal or substantially orthogonal to the direction of acoustic wave propagation. Similarly, an acoustic wave generated in the parallel-arm resonator P3 also undergoes the diffraction phenomenon when passing through the gap 25a. As a result, in an area where the reflector 23B is disposed, the acoustic wave scatters outward in the direction orthogonal or substantially orthogonal to the direction of acoustic wave propagation. This configuration makes it possible to reliably reduce or prevent acoustic coupling between the parallel-arm resonator P3 and the series-arm resonator S4, that is, acoustic coupling between the first acoustic wave element and the second acoustic wave element.

Further, since the diffraction phenomenon described above is utilized to diffract an acoustic wave, sufficient reduction or prevention of acoustic coupling can be achieved without increasing the dimension in the direction of acoustic wave propagation of the area where the diffracting component 25 is disposed. As a result, the dimension of the acoustic wave device 1 between the mutually adjacent first and second acoustic wave elements can be reduced to achieve further miniaturization.

Although the foregoing description is directed to the parallel-arm resonator P3 as a representative example of the first acoustic wave element, and to the series-arm resonator S4 as a representative example of the second acoustic wave element, the above-described configuration effectively reduces or prevents acoustic coupling for every pair of mutually adjacent first and second acoustic wave elements between which the diffracting component 25 indicated by the arrow A in FIG. 1 is disposed.

Therefore, the acoustic wave device 1 enables effective reduction of prevention of undesired ripple in the pass band of the transmitting filter 8.

Figure 4:
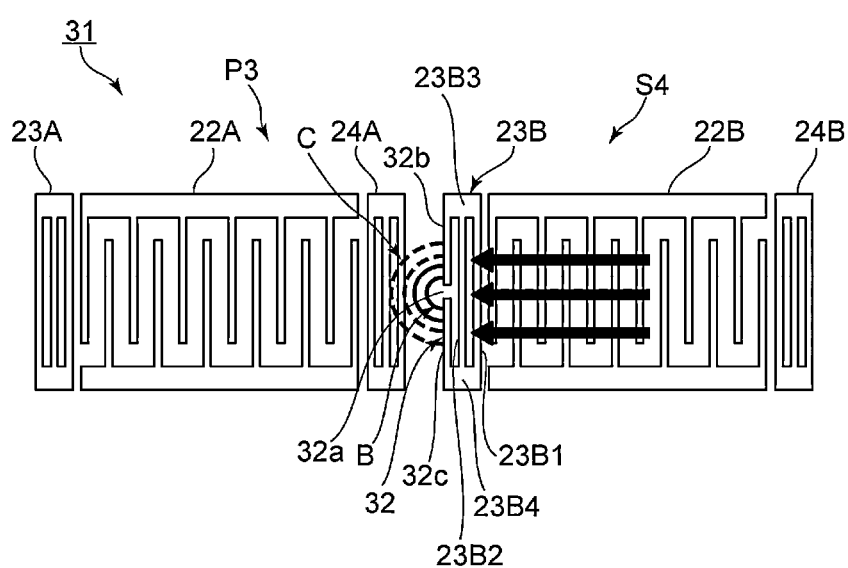
FIG. 4 is a plan view of an acoustic wave device according to a second preferred embodiment of the present invention, illustrating first and second acoustic wave elements that are adjacent to each other.

FIG. 4 is a plan view of an acoustic wave device according to a second preferred embodiment of the present invention, illustrating first and second acoustic wave elements and a diffracting component. In an acoustic wave device 31 according to the second preferred embodiment, the parallel-arm resonator P3 and the series-arm resonator S4 are adjacent to each other. The second preferred embodiment differs from the first preferred embodiment in that in the acoustic wave device 31, a diffracting component 32 is disposed within the reflector 23B. More specifically, the reflector 23B includes a plurality of electrode fingers 23B1 and 23B2, and the diffracting component 32. The diffracting component 32 includes a slit 32a. The diffracting component 32 includes a first portion 32b and a second portion 32c that are located on opposite sides of the slit 32a in the direction orthogonal or substantially orthogonal to the direction of acoustic wave propagation. As with the diffracting component 25 illustrated in FIG. 3, the diffracting component 32 extends in the direction orthogonal or substantially orthogonal to the direction of acoustic wave propagation, and has a linear or substantially linear shape. The length of the slit 32a, that is, the dimension of the slit 32a in the direction orthogonal or substantially orthogonal to the direction of acoustic wave propagation, is preferably smaller than a wavelength determined by each of the electrode finger pitch of the IDT electrode 22A and the electrode finger pitch of the IDT electrode 22B. That is, the length of the slit 32a is preferably smaller than both of the wavelength of an acoustic wave excited by the parallel-arm resonator P3, and the wavelength of an acoustic wave excited by the series-arm resonator S4. This configuration helps to ensure that sufficient reduction or prevention of acoustic coupling is achieved by utilizing the diffraction phenomenon.

In the reflector 23B, the electrode fingers 23B1 and 23B2 are shorted at both ends by busbars 23B3 and 23B4. The first portion 32b of the diffracting component 32 is also connected to the busbar 23B3, and the second portion 32c is connected to the busbar 23B4.

As described above, the acoustic wave device 31 has a similar configuration to the acoustic wave device 1 according to the first preferred embodiment, except that the diffracting component 32 including the slit 32a is disposed within the reflector 23B. Disposing a diffracting component within a reflector in this way ensures that, as indicated by arrows B and C in FIG. 4, a propagating acoustic wave undergoes the diffraction phenomenon, which causes the acoustic wave to scatter outward at a location near the parallel-arm resonator P3 in the direction orthogonal or substantially orthogonal to the direction of acoustic wave propagation. This makes it possible to effectively reduce or prevent acoustic coupling.

As described above, according to the present preferred embodiment, the diffracting component 32 may be disposed within at least one of two reflectors, rather than between the first acoustic wave element and the second acoustic wave element. This eliminates the need to dispose the diffracting component between the first acoustic wave element and the second acoustic wave element, thus making it possible to further reduce the distance between the first acoustic wave element and the second acoustic wave element. This enables further miniaturization of the acoustic wave device.

In the reflector 23B, the diffracting component 32 is positioned farther away from the second IDT electrode 22B than are the electrode fingers 23B1 and 23B2. This configuration helps to ensure that an acoustic wave can be reliably reflected by the electrode fingers 23B1 and 23B2 into the second IDT electrode 22B. Preferably, the diffracting component 32 is positioned outward of the electrode fingers 23B1 and 23B2 with respect to the direction of acoustic wave propagation in the second IDT electrode 22B. Alternatively, however, the diffracting component 32 may be disposed between the electrode fingers 23B1 and 23B2, or may be disposed at the location where the electrode finger 23B1 is disposed.

In the acoustic wave device 31, a plurality of diffracting components may be disposed within the reflector 23B.

In the foregoing description of the acoustic wave device 31, the diffracting component 32 is disposed within the reflector 23B. Alternatively, a similar diffracting component may be disposed within the reflector 24A, or a diffracting component may be disposed within both of the reflector 23B and the reflector 24A.

Figure 5:
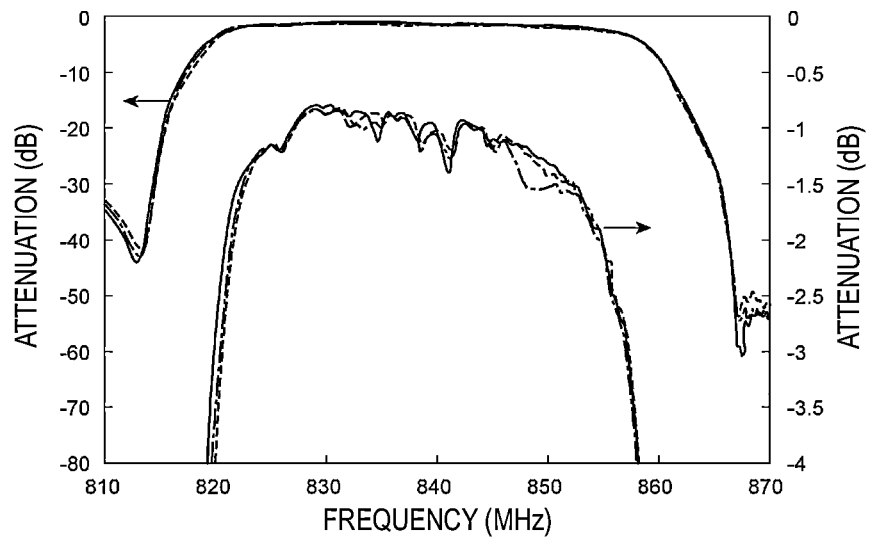
FIG. 5 illustrates the attenuation-frequency characteristics of an acoustic wave device according to a Comparative Example, the attenuation-frequency characteristics of an acoustic wave device according to Example 1 of a preferred embodiment of the present invention, and the attenuation-frequency characteristics of an acoustic wave device according to Example 2 of a preferred embodiment of the present invention.

An acoustic wave device according to Example 1, which represents the acoustic wave device according to the first preferred embodiment, an acoustic wave device according to Example 2, which represents the acoustic wave device according to the second preferred embodiment, and an acoustic wave device according to Comparative Example are fabricated. The attenuation-frequency characteristics of the transmitting filter are measured for each of these acoustic wave devices. The acoustic wave device according to Comparative Example is similar to that according to Example 1, except that the diffracting component described above is not provided. The results are illustrated in FIG. 5. In FIG. 5, solid lines represent the results for Example 1, broken lines represent the results for Example 2, and alternate long and short dashed lines represent the results for Comparative Example. As is apparent from FIG. 5, the acoustic wave device according to Comparative Example has large ripples near 848 MHz. In contrast, no such large ripples are observed for Example 1 and Example 2. This is presumed to be because acoustic coupling between mutually adjacent first and second acoustic wave elements is effectively reduced or prevented for Example 1 and Example 2.

Figure 6:
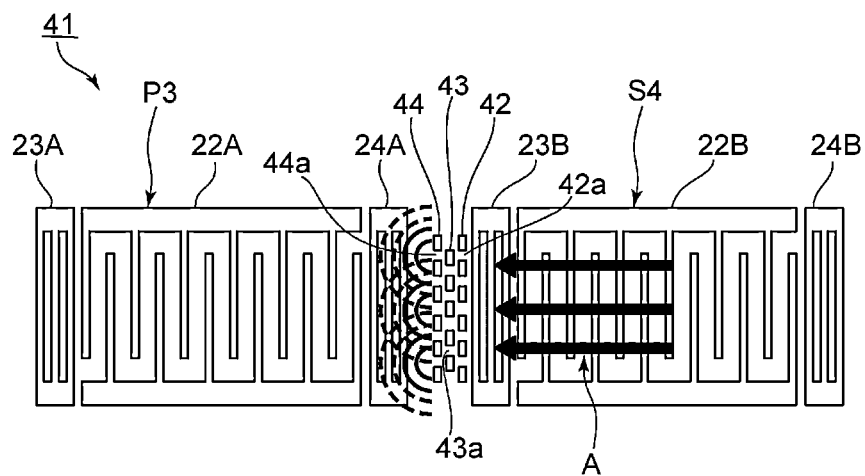
FIG. 6 is a plan view of an acoustic wave device according to a third preferred embodiment of the present invention, illustrating first and second acoustic wave elements and diffracting components.

FIG. 6 is a plan view of an acoustic wave device according to a third preferred embodiment of the present invention, illustrating first and second acoustic wave elements and diffracting components.

In an acoustic wave device 41 according to the third preferred embodiment, a plurality of diffracting components 42 to are disposed between the parallel-arm resonator P3, which defines and functions as the first acoustic wave element, and the series-arm resonator S4, which defines and functions as the second acoustic wave element. The acoustic wave device 41 is similar in configuration to the acoustic wave device 1 according to the first preferred embodiment, except that the diffracting components 42 to 44 are provided.

The diffracting components 42, 43, and 44 each extend in the direction orthogonal or substantially orthogonal to the direction of acoustic wave propagation, and have a linear or substantially linear shape. The diffracting components 42, 43, and 44 each include a plurality of slits. That is, the diffracting component 42 includes a plurality of slits 42a, the diffracting component 43 includes a plurality of slits 43a, and the diffracting component 44 includes a plurality of slits 44a. As described above, the diffracting component 42, the diffracting component 43, and the diffracting component 44, which extend linearly or substantially linearly, may respectively include the slits 42a, the slits 43a, and the slits 44a provided in a portion thereof.

In the acoustic wave device 41, the slits 42a and the slits 43a are located at different positions in the direction orthogonal or substantially orthogonal to the direction of acoustic wave propagation. Similarly, the slits 43a of the diffracting component 43, and the slits 44a of the diffracting component 44 are located at different positions in the direction orthogonal or substantially orthogonal to the direction of acoustic wave propagation. As a result, an acoustic wave propagating in a direction indicated by each arrow A is prevented from being directly transmitted toward the parallel-arm resonator P3. Preferably, the respective slits 42a and 43a of the mutually adjacent diffracting components 42 and 43 are positioned not to directly face each other with no other component interposed therebetween. That is, preferably, the respective slits 42a and 43a of the mutually adjacent diffracting components 42 and 43 are positioned not to directly overlap each other in the direction of acoustic wave propagation with no other component interposed therebetween. The respective slits 43a and 44a of the mutually adjacent diffracting components 43 and 44 are preferably positioned in the same or substantially the same manner as described above.

As described above, the acoustic wave device 41 is provided with the slits 42a, 43a, and 44a. This configuration helps to ensure that due to the diffraction phenomenon, a propagating acoustic wave can be scattered outward more effectively in the direction orthogonal or substantially orthogonal to the direction of acoustic wave propagation. Therefore, acoustic coupling between the first acoustic wave element and the second acoustic wave element can be reduced or prevented more effectively.

Figure 7:
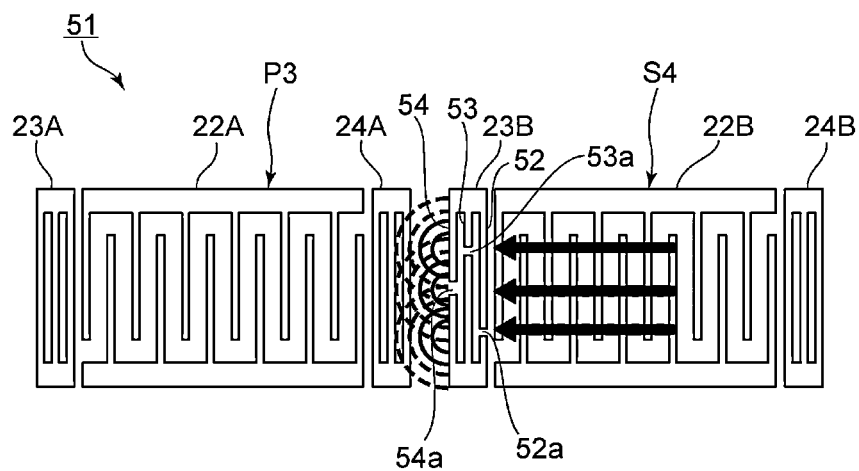
FIG. 7 is a plan view of an acoustic wave device according to a fourth preferred embodiment of the present invention, illustrating first and second acoustic wave elements and diffracting components.

FIG. 7 is a plan view of an acoustic wave device according to a fourth preferred embodiment of the present invention, illustrating first and second acoustic wave elements and diffracting components.

An acoustic wave device 51 corresponds to a modification of the acoustic wave device 31 according to the second preferred embodiment. In this case, a plurality of diffracting components 52 to 54 are disposed within the reflector 23B. The diffracting components 52 to 54 respectively include slits 52a, 53a, and 54a. In this way, a plurality of diffracting components 52 to 54 may be disposed within the reflector 23B. In this case as well, the respective slits 52a and 53a of the mutually adjacent diffracting components 52 and 53 are preferably located at different positions in a direction orthogonal or substantially orthogonal to the direction of acoustic wave propagation. Similarly, the respective slits 53a and 54a of the mutually adjacent diffracting components 53 and 54 are preferably located at different positions in the direction orthogonal or substantially orthogonal to the direction of acoustic wave propagation. This configuration helps to ensure that as an acoustic wave travels straight ahead through one acoustic wave element, the acoustic wave does not propagate to the other acoustic wave element, that is, the parallel-arm resonator P3. Accordingly, it is preferable that the respective slits of diffracting components that are adjacent to each other in the direction of acoustic wave propagation are positioned not to face each other with no other component interposed therebetween.

The acoustic wave device 51 is provided with a plurality of diffracting components 52 to 54 as described above. This configuration makes it possible to reduce or prevent acoustic coupling between the parallel-arm resonator P3 and the series-arm resonator S4 more effectively.

Figure 8:
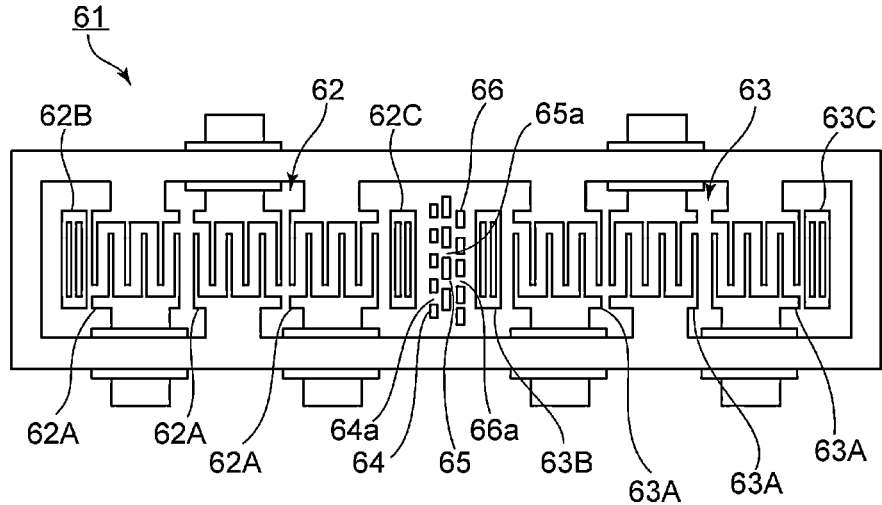
FIG. 8 is a plan view of an acoustic wave device according to a fifth preferred embodiment of the present invention.

FIG. 8 is a plan view of an acoustic wave device according to a fifth preferred embodiment of the present invention. In an acoustic wave device 61, a first acoustic wave element 62 and a second acoustic wave element 63 are adjacent to each other in the direction of acoustic wave propagation. The first acoustic wave element 62 is a 3-IDT longitudinally coupled resonator acoustic wave filter including a plurality of first IDT electrodes 62A and reflectors 62B and 62C. Similarly, the second acoustic wave element 63 is a 3-IDT longitudinally coupled resonator acoustic wave filter including plural second IDT electrodes 63A and reflectors 63B and 63C.

Diffracting components 64 to 66 are disposed between the first acoustic wave element 62 and the second acoustic wave element 63. The diffracting component 64 includes a plurality of slits 64a. The diffracting component 65 include a plurality of slits 65a. The diffracting component 66 includes a plurality of slits 66a. Due to the presence of the diffracting components 64 to 66 between the first acoustic wave element 62 and the second acoustic wave element 63, according to the fifth preferred embodiment, acoustic coupling between the first acoustic wave element 62 and the second acoustic wave element 63 can reduced or prevented.

According to preferred embodiments of the present invention, as in the fifth preferred embodiments, the mutually adjacent first and second acoustic wave elements may not necessarily be acoustic wave resonators, but may be longitudinally coupled resonator acoustic wave filters.

Although the foregoing description is directed to a configuration in which two longitudinally coupled resonator acoustic wave filters are adjacent to each other, this is not intended to be limiting. In an alternative configuration, one acoustic wave element may be a longitudinally coupled resonator acoustic wave filter, and the other acoustic wave element may be an acoustic wave resonator.

Figure 9:
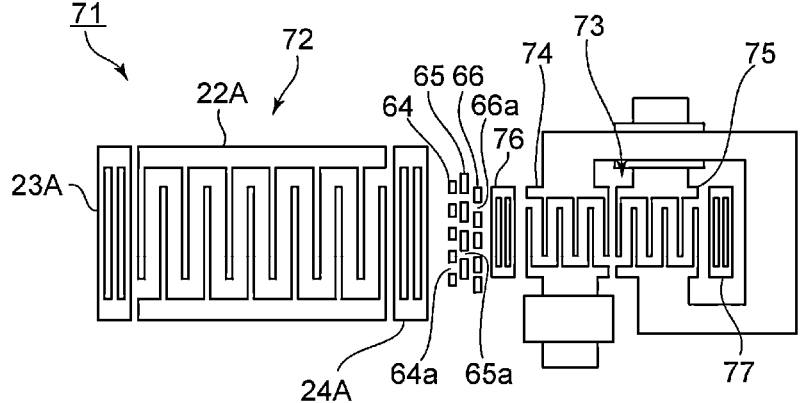
FIG. 9 is a plan view of an acoustic wave device according to a sixth preferred embodiment of the present invention.

FIG. 9 is a plan view of an acoustic wave device according to a sixth preferred embodiment of the present invention. An acoustic wave device 71 includes a first acoustic wave element 72, and a second acoustic wave element 73 adjacent to the first acoustic wave element 72. The first acoustic wave element 72 is a 1-port acoustic wave resonator. The second acoustic wave element 73 includes IDT electrodes 74 and 75, and reflectors 76 and 77. The IDT electrodes 74 and 75 each define a phase adjustment circuit, which adjusts the phase between acoustic wave filters. As described above, each acoustic wave element may not necessarily be a resonator or a filter, but may be an acoustic wave element defining a phase adjustment circuit. In this case as well, the presence of the diffracting components 64 to 66 between the first acoustic wave element 72 and the second acoustic wave element 73 makes it possible to reduce or prevent acoustic coupling between the first acoustic wave element 72 and the second acoustic wave element 73.

Figure 10:
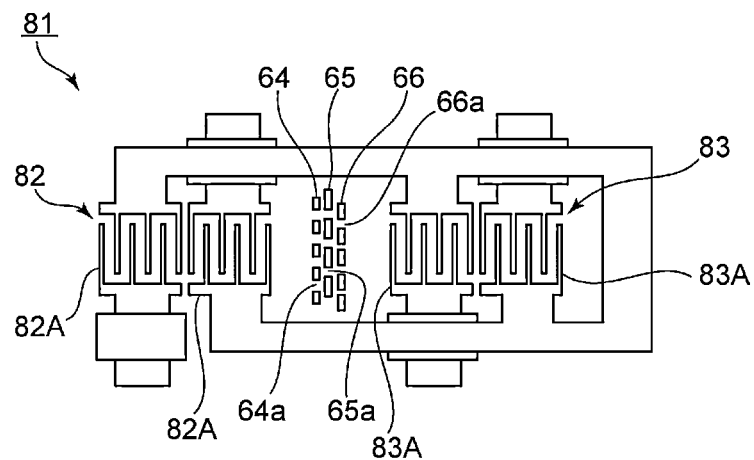
FIG. 10 is a plan view of an acoustic wave device according to a seventh preferred embodiment of the present invention.

FIG. 10 is a plan view of an acoustic wave device according to a seventh preferred embodiment of the present invention. In an acoustic wave device 81, a first acoustic wave element 82 and a second acoustic wave element 83 are adjacent to each other in the direction of acoustic wave propagation. The first acoustic wave element 82 and the second acoustic wave element 83 respectively include a plurality of IDT electrodes 82A and a plurality of IDT electrodes 83A. In this case, as with the second acoustic wave element 73 of the acoustic wave device 71, the first acoustic wave element 82 and the second acoustic wave element 83 each define a phase adjustment circuit. As described above, both of the first acoustic wave element and the second acoustic wave element may define a phase adjustment circuit. The first acoustic wave element 82 and the second acoustic wave element 83 do not include a reflector. That is, such phase adjustment circuits may not include a reflector.

In the acoustic wave device 81 as well, a plurality of diffracting components 64 to 66 are disposed between the first acoustic wave element 82 and the second acoustic wave element 83. Therefore, acoustic coupling between the first acoustic wave element 82 and the second acoustic wave element 83 can be effectively reduced or prevented.

As is apparent from the configuration of the acoustic wave device 81, the first and second acoustic wave elements according to preferred embodiments of the present invention may not include a reflector.

Figure 11A:
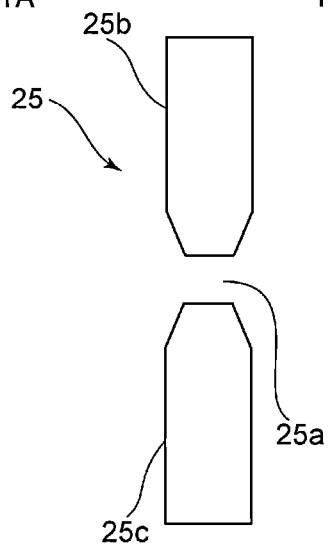
FIG. 11A is a plan view of a diffracting component of an acoustic wave device according to an eighth preferred embodiment of the present invention.
Figure 11B:
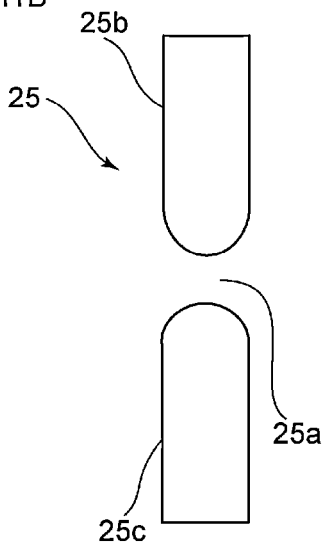
FIG. 11B is a plan view of a modification of a diffracting component of an acoustic wave device according to a preferred embodiment of the present invention.

FIG. 11A is a plan view of a diffracting component of an acoustic wave device according to an eighth preferred embodiment of the present invention. FIG. 11B is a plan view of a modification of the diffracting component according to a preferred embodiment of the present invention. The diffracting component 25 includes the gap 25a between the first portion 25b and the second portion 25c. The difference from the diffracting component 25 according to the first preferred embodiment is that each of the first portion 25b and the second portion 25c is cut in a corner area in its portion facing the gap 25a. That is, each of the first portion 25b and the second portion 25c is, in its end portion near the gap 25a, cut in a corner area located at each side in the direction of acoustic wave propagation. This allows a diffracted wave to become broader, thus making it possible to reduce attenuation length. Therefore, further space saving can be achieved.

As illustrated in FIG. 11B, each of the first portion 25b and the second portion 25c may be rounded in a corner area in its end portion facing the gap 25a.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate;
a first acoustic wave element including at least one first IDT electrode disposed on the piezoelectric substrate; and
a second acoustic wave element including at least one second IDT electrode disposed on the piezoelectric substrate; wherein
an intersecting region of the at least one first IDT electrode and an intersecting region of the at least one second IDT electrode overlap each other in an overlap region in a direction of acoustic wave propagation;

a diffracting component including a slit is provided in the overlap region;

the slit has a dimension in a direction orthogonal or substantially orthogonal to the direction of acoustic wave propagation that is smaller than a wavelength of an acoustic wave excited by the first acoustic wave element and a wavelength of an acoustic wave excited by the second acoustic wave element; and the wavelength of the acoustic wave excited by the first acoustic wave element is different than the wavelength of the acoustic wave excited by the second acoustic wave element.

2. The acoustic wave device according to claim 1, wherein the diffracting component includes a first portion and a second portion disposed in the direction orthogonal or substantially orthogonal to the direction of acoustic wave propagation with the slit interposed between the first portion and the second portion.

3. The acoustic wave device according to claim 2, wherein the slit is a gap between the first portion and the second portion, the gap defining a through-slit that penetrates the diffracting component.

4. The acoustic wave device according to claim 1, wherein the diffracting component has a linear or substantially linear shape.

5. The acoustic wave device according to claim 1, wherein the diffracting component includes a plurality of the slits.

6. The acoustic wave device according to claim 1, wherein a plurality of the diffracting components are disposed in the direction of acoustic wave propagation.

7. The acoustic wave device according to claim 6, wherein respective slits of the diffracting components do not overlap each other in the direction of acoustic wave propagation.

8. The acoustic wave device according to claim 1, wherein the first acoustic wave element includes a pair of first reflectors adjacent to opposite sides of a region of the first acoustic wave element in the direction of acoustic wave propagation, the region being a region where the at least one first IDT electrode is disposed;

the second acoustic wave element includes a pair of second reflectors adjacent to opposite sides of a region of the second acoustic wave element in the direction of acoustic wave propagation, the region being a region where the at least one second IDT electrode is disposed; and one first reflector of the pair of first reflectors of the first acoustic wave element, and one second reflector of the pair of second reflectors of the second acoustic wave element are adjacent to each other in the direction of acoustic wave propagation.

9. The acoustic wave device according to claim 8, wherein the diffracting component is disposed between the one first reflector and the one second reflector that are adjacent to each other in the direction of acoustic wave propagation.

10. The acoustic wave device according to claim 8, wherein the diffracting component is not connected to the one first reflector and the one second reflector that are adjacent to each other in the direction of acoustic wave propagation.

11. The acoustic wave device according to claim 8, wherein the diffracting component is disposed in at least one of the one first reflector and the one second reflector that are adjacent to each other in the direction of acoustic wave propagation.

12. The acoustic wave device according to claim 1, wherein a wavelength determined by an electrode finger pitch of the at least one first IDT electrode, and a wavelength determined by an electrode finger pitch of the at least one second IDT electrode are different from each other.

13. The acoustic wave device according to claim 1, further comprising:

a first acoustic wave filter including the first acoustic wave element; and a second acoustic wave filter including the second acoustic wave element, the second acoustic wave filter having a pass band different from a pass band of the first acoustic wave filter; wherein the first acoustic wave filter and the second acoustic wave filter are disposed on the piezoelectric substrate.

14. The acoustic wave device according to claim 1, wherein the first acoustic wave element is a parallel-arm resonator.

15. The acoustic wave device according to claim 1, wherein the second acoustic wave element is a series-arm resonator.

16. The acoustic wave device according to claim 1, wherein the diffraction component is made of a same material as the at least one first IDT electrode and the at least one second IDT electrode.

17. An acoustic wave device comprising:

a piezoelectric substrate;

a first acoustic wave element including at least one first IDT electrode disposed on the piezoelectric substrate; and a second acoustic wave element including at least one second IDT electrode disposed on the piezoelectric substrate; wherein an intersecting region of the at least one first IDT electrode and an intersecting region of the at least one second IDT electrode overlap each other in an overlap region in a direction of acoustic wave propagation;

a diffracting component including a slit is provided in the overlap region;

the first acoustic wave element includes a first reflector, and the second acoustic wave element includes a second reflector;

the slit is disposed between the first reflector and the second reflector in the direction of acoustic wave propagation; and the slit includes a plurality of slits that are serially disposed in a direction orthogonal or substantially orthogonal to the direction of acoustic wave propagation.

18. The acoustic wave device according to claim 17, wherein the slit has a dimension in the direction orthogonal or substantially orthogonal to the direction of acoustic wave propagation that is smaller than a wavelength of an acoustic wave excited by the first acoustic wave element and a wavelength of an acoustic wave excited by the second acoustic wave element.

19. An acoustic wave device comprising:

a piezoelectric substrate;

a first acoustic wave element including at least one first IDT electrode disposed on the piezoelectric substrate; and a second acoustic wave element including at least one second IDT electrode disposed on the piezoelectric substrate; wherein an intersecting region of the at least one first IDT electrode and an intersecting region of the at least one second IDT electrode overlap each other in an overlap region in a direction of acoustic wave propagation;

a diffracting component including a slit is provided in the overlap region; and the diffracting component is cut or rounded in a corner area in a portion of the diffracting component facing the slit.

* * * * *